(12) United States Patent
Ishikawa

(10) Patent No.: US 7,560,727 B2
(45) Date of Patent: Jul. 14, 2009

(54) ORGANIC ELECTROLUMINESCENT ELEMENT HAVING A PRISM STRUCTURE

(75) Inventor: Shun-ichi Ishikawa, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 336 days.

(21) Appl. No.: 11/210,794

(22) Filed: Aug. 25, 2005

(65) Prior Publication Data

US 2006/0043880 A1 Mar. 2, 2006

(30) Foreign Application Priority Data

Aug. 27, 2004 (JP) .............. 2004-248537

(51) Int. Cl.
*H05B 33/04* (2006.01)
(52) U.S. Cl. .............. 257/40; 257/E51.021
(58) Field of Classification Search .......... 257/40, 257/E51.021; 313/504
See application file for complete search history.

(56) References Cited

U.S. PATENT DOCUMENTS 6,516,152 B1 * 2/2003 Mukai et al. ............. 396/150

2004/0217702 A1* 11/2004 Garner et al. ............. 313/512

FOREIGN PATENT DOCUMENTS

JP 2931211 B2 5/1999
JP 2003-86353 A 3/2003

OTHER PUBLICATIONS

Gu et al., Optics Letters, vol. 22, No. 6, Mar. 15, 1997, pp. 396-398.

\* cited by examiner

*Primary Examiner*—Thomas L Dickey
(74) *Attorney, Agent, or Firm*—Birch, Stewart, Kolasch & Birch, LLP

(57) ABSTRACT

Provided is an organic electroluminescent element, comprising a transparent substrate and at least one organic layer containing a light-emitting layer between a pair of electrodes, wherein the transparent substrate is formed on the light output face side of the organic layer, a prism structure containing metal oxide is formed between the transparent substrate and an electrode formed on the light output face of the organic layer, and the prism vertexes therein are present facing the transparent substrate.

Also provided are a method of manufacturing a prism structure containing metal oxide on a transparent substrate, and a method of manufacturing an organic electroluminescent element by using the substrate having a prism structure.

6 Claims, 1 Drawing Sheet

ORGANIC ELECTROLUMINESCENT ELEMENT HAVING A PRISM STRUCTURE

CROSS-REFERENCE TO RELATED APPLICATION

This application claims priority under 35 USC 119 from Japanese Patent Application No. 2004-248537, the disclosure of which is incorporated by reference herein.

BACKGROUND OF THE INVENTION

1. Field of the Invention

The present invention relates to an organic electroluminescent element (light-emitting element, or EL element) that converts electric energy into light and emits the light.

2. Description of the Related Art

Numerous programs in research and development on various display elements are underway today, and among them, organic electroluminescent (EL) elements, which emit high-brightness light at low voltage, have been attracting attention as promising display elements.

However, organic electroluminescent elements remain significantly lower in luminous efficiency than inorganic LED elements and fluorescent lamps.

According to Thompson et al., external energy efficiency, an indicator of the luminous efficiency of an organic EL element, can be expressed as the product of internal energy efficiency and light output efficiency of an element ("Optics Letters", 1997, Vol. 22, No. 6, p. 396). That is, for improvement of the luminous efficiency of an organic EL element, it is necessary to improve the internal energy efficiency as well as the light output efficiency of the element.

Light output efficiency is a ratio of the light emitted from the front transparent substrate face of an element into the air to the light generated in the element. The light generated in the light-emitting layer passes through a number of interfaces between media different in refractive index before it is emitted into the air. According to Snell's Law of Refraction, light entering into each interface at an angle of not less than its critical angle is reflected totally by the interface back to the original layer and consequently is eliminated or released from the side face of the layer, resulting in a decrease in the amount of the light emitted from the front face of the element. As a result, for example, when the element is applied to a display, the display has lower front face brightness.

To overcome such problems, methods of suppressing the total reflection of light, using a prism structure effective in converging light have been proposed (see, for example, Japanese Patent No. 2931211).

This method involves preparing a substrate by placing a prism sheet manufactured by 3M on a glass having a thickness of 0.3 mm and adhering another glass having a thickness of 0.3 mm over the prism sheet, and then forming the organic EL element on the first glass to which the prism sheet is connected. The prism sheet, which is effective in converging light, alleviates the decrease in light output efficiency due to total reflection.

Also disclosed is a method of coating a thermosetting resin on a glass substrate to a thickness of 3 μm, hardening the resin by heating under an applied mold having prisms of 2 μm in base length and 2 μm in height, coating and hardening a polyimide resin thereon after removal of the mold and smoothing the surface of the resin film, and forming an organic EL element thereon (see, for example, JP-A No. 2003-86353).

The prism structure described in the method above is mainly made of an organic polymer material. Generally, organic polymers have a low refractive index, normally of around 1.35 to 1.5. In contrast, when a low-molecular weight material is used for the light-emitting layer of an organic EL element, the refractive index thereof is normally 1.7 or more at around the emission light wavelength, and in a phosphorescence-emitting element, is generally still higher (1.8 or more).

For prevention of total reflection of the light emitted from the light-emitting layer having a high-refractive index at the interface with a low-refractive index layer, it is necessary to make the refractive index of all the layers present between the light-emitting layer and the prism structure not less than the refractive index of the light-emitting layer, and the refractive index of the prism structure not less than the refractive index of the light-emitting layer.

It is usually possible to raise the refractive index of the prism structure by using a transparent inorganic material instead of the organic material and to improve the heat resistance thereof. Use of an inorganic material also eases restrictions in producing the element and improves the stability of the element during storage.

However, it is generally difficult to micro-fabricate a transparent inorganic material such as glass, and thus there are no known prism structures made of a transparent inorganic material.

In addition, there are no known organic EL elements having a prism structure made of such a high-refractive index material.

SUMMARY OF THE INVENTION

In a first aspect of the present invention provides an organic electroluminescent element, comprising a transparent substrate and at least one organic layer containing a light-emitting layer between a pair of electrodes, wherein the transparent substrate is formed on the light output face side of the organic layer, a prism structure containing metal oxide is formed between the transparent substrate and an electrode on the light output face of the organic layers, and the vertexes of the prisms in the prism structure are present facing the transparent substrate.

In a second aspect of the present invention provides a method of manufacturing a substrate having a prism structure, comprising the steps of forming an organic prism structure of an organic material on a transparent substrate, coating onto the organic prism structure and drying an aqueous material containing a metal oxide sol or precursor thereof, burning the organic material off as a gas by heating it to 400° C. or higher, and forming a prism structure containing the metal oxide on the transparent substrate with its prism vertexes facing the transparent substrate.

In a third aspect of the invention provides a method of manufacturing an organic electroluminescent element having a transparent substrate and at least one organic layer containing a light-emitting layer between a pair of electrodes wherein the transparent substrate is formed on the light output face side of the organic layers, comprising the steps of forming an organic prism structure of an organic material on a transparent substrate, coating onto the organic prism structure and drying an aqueous material containing a metal oxide sol or precursor thereof, burning the organic material off as a gas by heating it to 400° C. or higher, forming a prism structure containing the metal oxide on the transparent substrate with its prism vertexes facing the transparent substrate, and forming a pair of electrodes and at least one organic layer including a light-emitting layer between the pair of electrodes on the surface of the prism structure opposite to the prism vertexes.

BRIEF DESCRIPTION OF THE DRAWINGS

The present invention will become more frilly understood from the detailed description given hereinbelow and the accompanying drawing. The drawing is not to scale, and is given by way of illustration only. Accordingly, the drawing should not be construed as limiting the present invention.

DETAILED DESCRIPTION OF THE INVENTION

Figure 1:
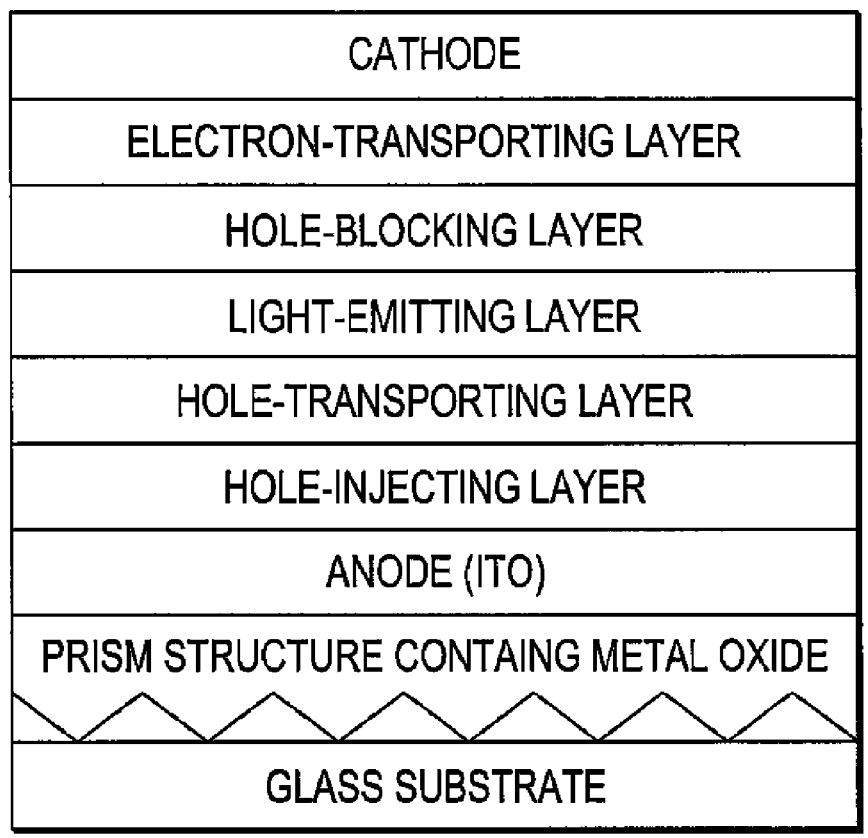
FIG. 1 is a schematic diagram of an organic electroluminescent device in accordance with the present invention.

The present invention provides a high-brightness organic electroluminescent element with restricted total reflection of light The invention also provides a method of manufacturing a substrate having a high-refractive index prism structure with restricted total reflection of light, and a method of manufacturing a high-brightness organic electroluminescent element containing the substrate obtained by the method having a prism structure with restricted total reflection of light.

Hereinafter, the invention will be described in detail.

[Organic electroluminescent element]

The organic electroluminescent element according to the invention is an organic electroluminescent element, comprising a transparent substrate and at least one organic layer containing a light-emitting layer between a pair of electrodes, wherein the transparent substrate is formed on the light output face side of the organic layers, a prism structure of metal oxide is formed between the transparent substrate and the electrode on the light output face of the organic layers, and the prism vertexes in the prism structure are present facing the transparent substrate.

The organic electroluminescent element according to the invention in such a configuration suppresses total reflection of the light generated in the light-emitting element and provides a high-brightness light-emitting element.

<Prism structure containing metal oxide>

The organic electroluminescent element according to the invention has a prism structure of metal oxide between the transparent substrate and the electrode on the light output face of the organic layer, (hereinafter, referred to simply as "prism structure").

The prism structure according to the invention means a structure having two or more prisms, for example, a metal oxide film having V-shaped grooves formed on the surface at a certain pitch. The grooves may be formed mono-, bi-, tri-, or poly-directionally; the grooves become pyramidal in shape when formed in two orthogonal directions and triangular when formed in three directions at a pitch of 60 degrees. In the invention, prism structures having grooves formed in one direction or in two orthogonal directions (pyramidal in shape) are preferable from the viewpoint of convergence efficiency and productivity.

Generally, a prism means a transparent material having two or more optical planes, at least a pair of which is not even closely in parallel.

Prisms are effective in converging light and thus have been used as optical parts. For example, so-called prism sheets, which have numerous V-shaped grooves aligned in parallel at a pitch of dozens to hundreds of microns formed over one entire surface of a plastic film, have been used for converging back light in liquid crystal display devices. In such a case, prisms having a wavy face or those having prisms with rounded edges are also used for the same purpose. The prism structures according to the invention also include those prism structures having a curved face or rounded prism edges.

The pitch between prisms exerts relatively smaller influence on brightness, but a smaller pitch seemingly leads to improvement in contrast. In practice, the pitch between prisms is preferably 0.1 to 50 µm, more preferably 0.5 to 30 µm, and particularly preferably 1 to 20 µm, from the point of the productivity of prism structure.

Alternatively, a smaller prism apex angle leads to greater increase in brightness but also to decrease in contrast. On the contrary, a larger apex angle leads to smaller decrease in contrast but also to smaller improvement in brightness. Accordingly, the apex angle is preferably 60 to 120 degrees and more preferably 70 to 110 degree and still more preferably 80 to 100 degree.

The prism structure should contain a metal oxide but may also contain other additives as needed.

Examples of the metal oxides for use in the invention include silicon oxide, titanium oxide, niobium oxide, cerium oxide, tin oxide, tin antimony oxide, yttrium oxide, zirconium oxide, and the like; and among them, titanium oxide, niobium oxide, and zirconium oxide are preferable and titanium oxide is particularly preferable, from the viewpoint of high refractive index.

The content of the metal oxide in the prism structure is preferably 80 wt % or more and more preferably 90 wt % or more with respect to the total solid content. The metal oxides may be used alone or in combination of two or more.

In a bottom emission-mode element, in which light is emitted from the circuit board side of TFT or the like, the organic electroluminescent element according to the invention can be produced by forming a light-emitting element on the prism structure described above in a normal manner.

On the other hand, in a top emission-mode element, in which the light is emitted from the face opposite to the circuit board side of TFT or the like, the organic electroluminescent element is produced by forming a light-emitting element up to its cathode on a separate substrate and adhering the transparent substrate above to the substrate so that the prism structure of the transparent substrate above faces the light-emitting layer. Examples of the transparent substrates for use in the organic electroluminescent element according to the invention include quartz glass, non-alkali glass, soda lime glass, plastic films. The organic electroluminescent element may be a fluorescence- or phosphorescence-emitting element. Examples of other components such as electrodes and organic layer in the electroluminescent element according to the invention include those described in JP-A Nos. 2004-221068, 2004-214178, 2004-146067, 2004-103577, 2003-323987, 2002-305083, 2001-172284, 2000-186094, and others.

The organic electroluminescent element according to the invention has a prism structure containing metal oxide formed on a transparent substrate as the prism vertexes of the prism structure face the transparent substrate, and the surface of the prism structure opposite to the prism vertexes is preferably smoothed sufficiently because the element is formed thereon.

The prism vertexes may be in contact with or separated from the transparent substrate, but preferably in contact with the transparent substrate above from the point of mechanical strength.

The surface may be smoothed in the step of or after forming the prism structure, for example, by polishing or pressurization. In addition, a separate transparent smooth layer may be formed additionally.

The smooth layer may be formed, for example, by sputtering with a high-refractive index material. An example of the material for use is titanium oxide.

The prism structure according to the invention has an aperture formed between the prism and the transparent substrate (for example, glass substrate); and the aperture may contain an inert gas such as nitrogen or argon that does not affect the organic EL element.

[Method of manufacturing a substrate having a prism structure]

The method of manufacturing a substrate having a prism structure according to the invention comprises the steps of forming a prism structure of an organic material on a transparent substrate (for example, glass) (hereinafter, also referred to as "organic prism structure"), coating onto the organic prism structure and drying an aqueous material containing a metal oxide sol or precursor thereof and thus forming a smooth surface, burning the organic material off as a gas by heating it to 400° C. or higher, and forming a prism structure containing the metal oxide on the transparent substrate so that the prism vertexes face the transparent substrate.

As described above, a high-refractive index prism structure with its prism vertexes facing the transparent substrate can be prepared by coating and drying an aqueous material containing a metal oxide over the organic prism structure functioning as a mold formed on the transparent substrate, and burning off the organic material for the organic prism structure.

The substrate having a prism structure means a transparent substrate on which a prism structure having prisms is formed in such a manner that the vertexes of the prisms face the transparent substrate, and the prism structure is the same as the prism structure containing the metal oxide described above and the preferable embodiments thereof are also the same.

Hereinafter, the method of manufacturing a substrate having a prism structure will be described in detail.

(1) The prism structure having a prism pattern of an organic material is formed by coating a liquid organic material on a transparent substrate (for example, glass), hardening the organic material in a prism pattern-preformed mold by action of light or heat, and removing the mold.

Among the materials for the transparent substrate described above, non-alkali and quartz glasses are preferable from the viewpoint of heat resistant temperature.

The organic material is not particularly limited if it hardens by action of light or heat, but photocuring resins such as UV-curing epoxy and acrylic resins are preferable.

The prism pattern-preformed mold having a desirable apex angle and a desirable pitch can be prepared, for example, by cutting the surface of a metal Ni plate with a diamond bite at a properly predetermined prism apex angle and a pitch between prism vertexes. Alternatively, a silicone mold having a transferred pattern prepared by applying a silicone elastomer or the like into the metal mold, hardening the elastomer, and separating the hardened resin may be used.

The organic prism structure formed with a resin described above has a hydrophobic surface, and the surface may be hydrophilized. Examples of the hydrophilizing treatments include irradiation with UV ray, for example from low-pressure mercury lamp or excimer lamp, in air (ozone treatment), and the like.

(2) Then, a smooth surface is formed by applying and drying an aqueous material containing a metal oxide sol or precursor thereof as the primary component on the organic prism structure obtained. A transparent prism structure containing a metal oxide having the prism vertexes facing the transparent substrate (for example, glass) is formed by subsequent heating to 400° C. or more.

The aqueous material contains a metal oxide sol containing the metal oxide above or precursor thereof.

The metal oxide may be used in the form of sol; examples of the metal oxide sols include silicon oxide sol, titanium oxide sol, niobium oxide sol, cerium oxide sol, tin oxide sol, tin antimony oxide sol, yttrium oxide sol, zirconium oxide sol, and the like; and among them, titanium oxide, niobium oxide, and zirconium oxide sols are preferable and titanium oxide sol is particularly preferable from the viewpoint of high-refractive index.

The metal oxide sol may be prepared in the film by the sol-gel reaction by using a metal alkoxide or the hydrolysate thereof.

In addition, a binder is preferably added for control of the thickness of the film after coating and drying of the aqueous material.

Examples of the binders include water-soluble organic polymer binders having hydrogen-bonding groups such as polyethylene glycol, PVA, and gelatin; inorganic binders such as water glass and metal biphosphate salts; and the like; and among them, addition of an organic binder such as PVA is preferable for making the film more resistant to cracking during drying.

The amount of the binder added is preferably 5 to 50 wt % and more preferably 20 to 30 wt % with respect to the metal oxide.

The binders may be used alone or in combination of two or more.

A surfactant may be added to the metal oxide sol for improvement in coating efficiency.

The surfactant for use is not particularly limited, but a nonionic or anionic surfactant is preferable.

When the aqueous material containing the metal oxide sol or precursor thereof is heated after coating and drying, the organic components are eliminated as a gas and at the same time, the M-OH groups (M: metal) on the surface of the metal oxide particles bind to each other by dehydration condensation, forming a firm continuous structure wherein the particles are fused. If the prism structure of metal oxide thus formed contains some OH groups on the particle surface, $H_2O$ may be gradually released from the organic EL element using the same during storage, affecting the organic EL element. The heating temperature is preferably 400° C. or more, more preferably 600° C. or more, for prevention of the above-described adverse effects. The upper limit of the heating temperature is less than the heat resistant temperature of the transparent substrate for use.

The substrate having a prism structure obtained by the method of manufacture according to the invention may be used without particular limitation in any applications where light convergence is desirable, but is preferably used in a light-emitting element and particularly preferably in an organic electroluminescent element such as a fluorescence- or phosphorescence-emitting element.

[Method of manufacturing an organic electroluminescent element]

The method of manufacturing the organic electroluminescent element according to the invention is a method of manufacturing an organic electroluminescent element comprising a transparent substrate and at least one organic layer containing a light-emitting layer between a pair of electrodes, wherein the transparent substrate is formed on the light output face side of the element, and the transparent substrate is a substrate having a prism structure, which is formed on the light-emitting layer side of the transparent substrate.

By using a high-refractive index substrate having a prism structure that restricts total reflection of light and forming the prism structure described above on the light-emitting layer thereof, it is possible to make the organic electroluminescent element obtained by the method converge the light emitted from the light-emitting layer efficiently without total reflection and emit a high-brightness light.

The substrate having a prism structure, transparent substrate, electrode, light-emitting layer, organic layer, and others for use in the method of manufacturing the organic electroluminescent element according to the invention are the same as those described for the organic electroluminescent element and the method of manufacturing a substrate having a prism structure, and the preferable examples thereof are the same.

EXAMPLES

Hereinafter, the invention will be described with reference to Examples, but it should be understood that the invention is not limited thereby. FIG. 1 shows a schematic diagram of an organic electroluminescent element based on Example 1.

Example 1

<Preparation of organic EL element>

(Preparation of silicone prism pattern structure)

A Ni mold for a prism pattern having an apex angle of 90 degrees and a pitch of 10 μm was prepared by cutting the surface of a Ni plate with a diamond bite. A silicone elastomer was applied and hardened thereon, and the silicone elastomer was removed from the mold, to give a silicone prism pattern.

(Preparation of organic prism structure)

A UV-curing resin OG 125 (manufactured by Epoxy Technology Inc.) was coated on a non-alkali glass substrate having a thickness of 0.7 mm in an amount of 16 g/m² (12 ml/m²). The silicone prism pattern structure above was pressed over the resin, and a UV ray (365 nm) was irradiated from the glass substrate side for 1 minute, allowing the resin to harden. Subsequent separation of the silicone pattern structure gave a micro-prism pattern formed on the glass substrate. The pattern was exposed to an excimer lamp (172 nm) in air for 10 minutes and the surface thereof was hydrophilized, to give an organic prism structure.

(Preparation of prism structure containing metal oxide)

An aqueous material was prepared by mixing Tainoc A-6 (titanium oxide sol, manufactured by Taki Chemical Co.,), an aqueous solution of PVA102 (polyvinylalcohol, manufactured by Kuraray Co., Ltd., 30% by mass with respect to titanium oxide), and sodium dodecylbenzenesulfonate (0.05% in coating solution).

The aqueous material was coated on the micro prism above (organic prism structure) with an applicator (in an amount of 20 g/m² as titanium oxide) and dried at room temperature. The coated product was processed under heat in an electric furnace at 600° C. for 1 hour.

The epoxy resin and the PVA in the organic material were eliminated by the heat treatment, and a titanium oxide prism structure with the prism vertexes in the prism structure facing the glass substrate that has a smooth surface on the opposite face is formed on the glass substrate.

The refractive index of the prism structure was 1.8 or more in the entire visible wavelength range.

(Preparation of organic EL element)

An anode of indium tin oxide [ITO, indium/tin: 95/5 (molar ratio)] was formed on the smooth surface of the prism structure (thickness: 0.15 μm) by DC sputtering. The surface resistance of the anode was 10Ω/□.

An organic compound layer was formed on the anode.

A copper phthalocyanine layer having a thickness of 0.01 μm was formed additionally by vacuum deposition as the hole-injecting layer. Then, an α-NPD (N,N'-di-α-naphthyl-N,N'-diphenyl-benzidine) layer having a thickness of 0.06 μm was formed by vacuum deposition as the hole-transporting layer.

Subsequently, a layer of CBP and an iridium complex [Ir(ppy)$_3$, phosphorescent organic metal complex] was formed by simultaneous two-component vapor deposition, respectively as the primary component (host material) and the secondary component (dopant) of the light-emitting layer. The vapor deposition speed was controlled so that the content of the iridium complex [Ir(ppy)$_3$] became 5% by mass with respect to the host material, and a light-emitting layer having a thickness of 0.03 μm was formed on the hole-transporting layer.

Further, a layer of BAlq$_2$ having a thickness of 0.01 μm was formed thereon as a hole-blocking layer.

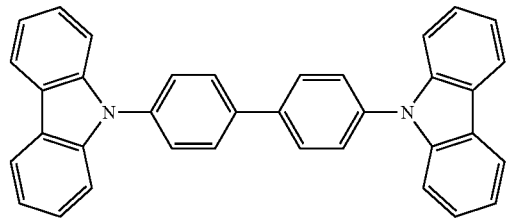

CBP

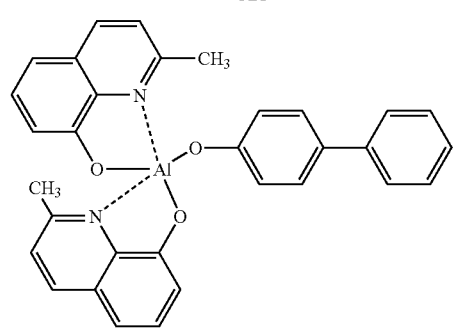

Balq$_2$

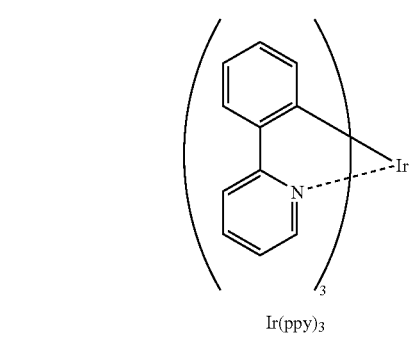

Ir(ppy)$_3$

-continued

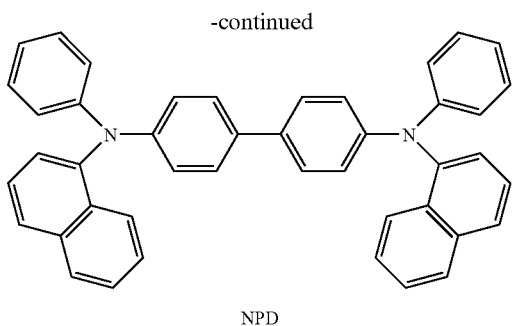

NPD

Then, a layer of Alq₃ was formed similarly by vapor deposition over the hole-blocking layer as an electron-transporting layer. The layer thickness was 0.035 µm.

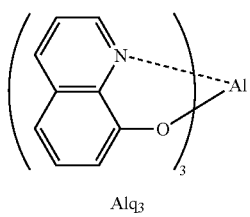

Alq₃

After the organic compound layer was placed under a patterned mask, as a cathode, a layer of magnesium and silver (molar ratio: 10:1) having a thickness of 0.25 µm and then a layer of silver having a thickness of 0.3 µm were formed by vapor deposition over the organic compound layer in a vapor deposition device.

An organic EL element was prepared by connecting aluminum lead wires respectively to the anode and the cathode.

Separately, the refractive index of the thin film consisting only of a light-emitting layer of CBP and Ir(ppy)₃ was determined by ellipsometry and found to be 1.8 at the emission wavelength of 510 nm.

Comparative Example 1

<Preparation of organic EL element>

A UV-curing resin OG125 (refractive index after hardening: 1.46) was coated on a glass substrate having a thickness 70 µm (first base material) in an amount of 16 g/m² (12 ml/m²). The coated substrate was pressed with the silicone prism pattern prepared in Example 1, and the resin was hardened by exposure to a UV ray (365 nm) from the glass substrate side for 1 minute. Subsequent separation of the silicone pattern gave a prism formed on the glass substrate having a thickness 70 µm.

The substrate was adhered to a glass substrate having a thickness of 0.7 mm (second base material) with the prism surface facing the second base material.

An anode, an organic layer, and a cathode were formed on the first base material side of the adhered substrate in a similar manner to the method of Example 1, to give an organic EL element.

Comparative Example 2

<Preparation of organic EL element>

An organic EL element was prepared in a similar manner to Example 1, except that a glass substrate carrying no prism structure was used.

<Evaluation>

A direct current voltage of 12 V was applied to each of the elements obtained in Examples and Comparative Examples, allowing it to emit light. The brightness of each element was determined relatively with respect to the brightness of the element I of Comparative Example 2 as 1, and the relative value was used as an indicator of improvement in brightness.

TABLE 1

| | Prism structure | | Light-emitting layer | Improvement in brightness |
|---|---|---|---|---|
| | Material | Refractive index | Refractive index | |
| Example 1 | TiO₂ | 1.8 | 1.8 | 2.5 |
| Comparative Example 1 | Epoxy resin | 1.46 | 1.8 | 1.6 |
| Comparative Example 2 | — | — | 1.8 | 1 |

As apparent from Table 1 above, the improvement in brightness when the metal oxide prism structure of Example 1 was used was superior to that when any one of the prism structures of Comparative Examples was used: when an organic material prism structure was used or when no prism structure was used.

What is claimed is:

1. An organic electroluminescent element comprising a transparent substrate and at least one organic layer containing a light-emitting layer between a pair of electrodes, wherein the transparent substrate is formed on the light output face side of the organic layer, a prism structure containing metal oxide is formed between the transparent substrate and the electrode formed on the light output face of the organic layer, and the prism vertexes therein are present facing the transparent substrate, wherein the content of the metal oxide in the prism structure is approximately 80% by mass or more with respect to the total solids.

2. The organic electroluminescent element according to claim 1, wherein the metal oxide is a metal oxide selected from the group consisting of silicon oxide, titanium oxide, niobium oxide, cerium oxide, tin oxide, tin antimony oxide, yttrium oxide, and zirconium oxide.

3. The organic electroluminescent element according to claim 1, wherein the prism structure has grooves formed in one direction or in two orthogonal directions.

4. The organic electroluminescent element according to claim 1, wherein the pitch of the prisms is approximately 0.1 to 50 µm.

5. The organic electroluminescent element according to claim 1, wherein the apex angle of the prisms is approximately 60 to 120 degrees.

6. The organic electroluminescent element according to claim 1, wherein the surface of the prism structure opposite to the prism vertexes is smoothed.

* * * * *